(12) United States Patent
Chen

(10) Patent No.: US 11,289,541 B2
(45) Date of Patent: Mar. 29, 2022

(54) RESISTIVE RANDOM ACCESS MEMORY DEVICES AND METHODS FOR FORMING THE SAME

(71) Applicant: Winbond Electronics Corp., Taichung (TW)

(72) Inventor: Frederick Chen, Tainan (TW)

(73) Assignee: WINBOND ELECTRONICS CORP., Taichung (TW)

( * ) Notice: Subject to any disclaimer, the term of this patent is extended or adjusted under 35 U.S.C. 154(b) by 12 days.

(21) Appl. No.: 16/683,467

(22) Filed: Nov. 14, 2019

(65) Prior Publication Data

US 2021/0151504 A1     May 20, 2021

(51) Int. Cl.
*H01L 27/24* (2006.01)
*H01L 45/00* (2006.01)
*H01L 29/08* (2006.01)
*H01L 29/10* (2006.01)
*H01L 29/417* (2006.01)
(Continued)

(52) U.S. Cl.
CPC .... *H01L 27/2436* (2013.01); *H01L 21/26513* (2013.01); *H01L 21/30604* (2013.01); *H01L 21/74* (2013.01); *H01L 27/2463* (2013.01); *H01L 29/0847* (2013.01); *H01L 29/1083* (2013.01); *H01L 29/41791* (2013.01); *H01L 29/66492* (2013.01); *H01L 29/66515* (2013.01); *H01L 29/66795* (2013.01); *H01L 29/7833* (2013.01); *H01L 29/7851* (2013.01); *H01L 45/08* (2013.01); *H01L 45/16* (2013.01)

(58) Field of Classification Search
CPC ........... H01L 27/2436; H01L 29/66492; H01L 29/66515; H01L 29/7833; H01L 45/08; H01L 29/41791; H01L 21/74; H01L 29/66795; H01L 21/30604; H01L 45/16; H01L 29/7851; H01L 29/0847; H01L 27/2463; H01L 21/26513; H01L 29/1083; H01L 21/823431; H01L 21/823821; H01L 21/845; H01L 27/0924; H01L 27/0886; H01L 27/10826
See application file for complete search history.

(56) References Cited

U.S. PATENT DOCUMENTS 9,558,946 B2   1/2017   Tsai et al.
9,768,231 B2   9/2017   Tran et al.
(Continued)

FOREIGN PATENT DOCUMENTS

CN         104979013 A  * 10/2015
CN         104979013 A  * 10/2015
WO    WO-2019005113 A1 *  1/2019  ......... H01L 27/2418

*Primary Examiner* — Bitew A Dinke
(74) *Attorney, Agent, or Firm* — Muncy, Geissler, Olds & Lowe, PC

(57) ABSTRACT

A resistive random access memory (RRAM) device is provided. The RRAM device includes a gate structure on a substrate, and a source region and a drain region disposed on opposite sides of the gate structure on the substrate. The source region includes a semiconductor bulk, and the drain region includes a plurality of semiconductor fins adjacent to the semiconductor bulk, wherein the semiconductor fins are separated from each other by an isolation layer. The RRAM device further includes a plurality of RRAM units, wherein each of the RRAM units electrically contacts one of the semiconductor fins.

16 Claims, 6 Drawing Sheets

(51) Int. Cl.
*H01L 29/78* (2006.01)
*H01L 21/265* (2006.01)
*H01L 21/306* (2006.01)
*H01L 21/74* (2006.01)
*H01L 29/66* (2006.01)

(56) References Cited

U.S. PATENT DOCUMENTS

| | | | | |
|---|---|---|---|---|
| 2006/0202266 A1* | 9/2006 | Radosavljevic | ...... | H01L 23/485 |
| | | | | 257/344 |
| 2007/0262396 A1* | 11/2007 | Zhu | ...... | H01L 23/485 |
| | | | | 257/401 |
| 2011/0147839 A1* | 6/2011 | Yagishita | ...... | H01L 29/785 |
| | | | | 257/347 |
| 2013/0094280 A1* | 4/2013 | Widjaja | ...... | G11C 14/0036 |
| | | | | 365/148 |
| 2015/0325626 A1* | 11/2015 | Lin | ...... | H01L 45/146 |
| | | | | 257/379 |
| 2015/0325683 A1* | 11/2015 | Cho | ...... | H01L 29/66795 |
| | | | | 438/283 |
| 2016/0056295 A1* | 2/2016 | Wen | ...... | H01L 29/7851 |
| | | | | 257/369 |
| 2016/0087053 A1* | 3/2016 | Kim | ...... | H01L 21/823871 |
| | | | | 257/369 |
| 2016/0307894 A1* | 10/2016 | Chien | ...... | H01L 29/42356 |
| 2017/0098709 A1* | 4/2017 | Dias | ...... | H03D 7/1441 |
| 2017/0323942 A1* | 11/2017 | Voldman | ...... | H01L 27/1211 |
| 2018/0069052 A1* | 3/2018 | Sekar | ...... | H01L 21/845 |
| 2018/0090583 A1* | 3/2018 | Choi | ...... | H01L 21/76855 |
| 2018/0190810 A1* | 7/2018 | Li | ...... | H01L 29/785 |
| 2018/0286861 A1* | 10/2018 | Choi | ...... | H01L 29/41791 |
| 2018/0315481 A1* | 11/2018 | Lin | ...... | G11C 16/26 |
| 2019/0097006 A1* | 3/2019 | Li | ...... | H01L 21/823431 |
| 2019/0123104 A1* | 4/2019 | Yang | ...... | H01L 45/146 |
| 2019/0148556 A1* | 5/2019 | Wang | ...... | H01L 21/0228 |
| | | | | 257/365 |
| 2019/0198100 A1* | 6/2019 | Pillarisetty | ...... | H01L 45/146 |
| 2020/0343445 A1* | 10/2020 | Strutt | ...... | H01L 45/146 |
| 2020/0381481 A1* | 12/2020 | Hekmatshoartabari | ...... | |
| | | | | H01L 27/226 |
| 2021/0057488 A1* | 2/2021 | Hwu | ...... | H01L 45/1233 |
| 2021/0082757 A1* | 3/2021 | Lee | ...... | H01L 29/42376 |

* cited by examiner

RESISTIVE RANDOM ACCESS MEMORY DEVICES AND METHODS FOR FORMING THE SAME

BACKGROUND

Technical Field

The disclosure relates to resistive random access memory devices and methods for forming the same.

Description of the Related Art

Resistive random access memory (RRAM) is one type of non-volatile memory. Due to the numerous advantages of RRAM, which include its simple structure, low operation voltage, rapid operation time, multi-bit storage, low cost, and durability, RRAM have been widely developed recently. The basic structure of a commonly used RRAM is composed of one transistor and one resistor (1T1R). The resistance value of the resistor can be changed by varying the applied bias, so that the device can be in a high resistance state or a low resistance state, and thereby 0 or 1 of the digital signal is recognized.

RRAM in an 1TNR structure effectively decreases the cell size by increasing capacity. However, two resistors connected to the same transistor can affect one another due to the possibility of sneak current flowing from one to the other, so the reliability of the device is compromised.

Although existing RRAM devices and methods for forming the same have been adequate for their intended purposes, they have not been entirely satisfactory in all aspects. Therefore, up to the present, there are still some problems to be overcome in regards to the technologies of RRAM devices.

BRIEF SUMMARY OF THE DISCLOSURE

Some embodiments of the disclosure provide a resistive random access memory (RRAM) device. The RRAM device includes a gate structure on a substrate, and a source region and a drain region disposed on opposite sides of the gate structure on the substrate. The source region includes a semiconductor bulk, and the drain region includes a plurality of semiconductor fins adjacent to the semiconductor bulk, wherein the semiconductor fins are separated from each other by an isolation layer. The RRAM device further includes a plurality of RRAM units, wherein each of the RRAM units electrically contacts one of the semiconductor fins.

Some embodiments of the disclosure provide a method for forming a RRAM device. The method includes providing a substrate having a source region and a drain region adjacent to the source region, recessing the substrate to form a semiconductor bulk in the source region and to form a plurality of semiconductor fins parallel to each other in the drain region, forming a gate structure on the substrate, and forming a plurality of RRAM units. The semiconductor fins adjacent to the semiconductor bulk. The source region and the drain region are on opposite sides of the gate structure. Each of the RRAM units electrically connects one of the semiconductor fins.

A detailed description is given in the following embodiments with reference to the accompanying drawings.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
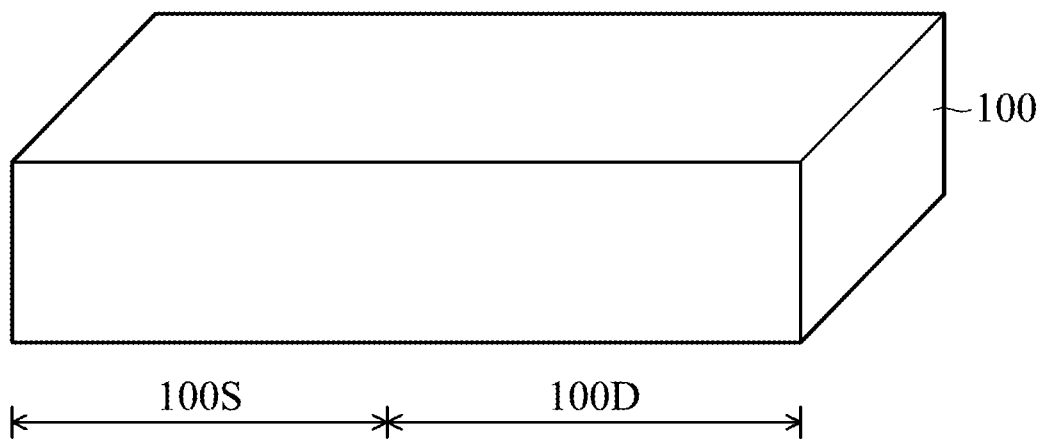
FIGS. 1-3 are perspective views illustrating intermediate stages of an exemplary method for forming the resistive random access memory device in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of resistive random access memory (RRAM) devices and methods for forming the same are provided, especially a RRAM device with 1TNR structure. In some embodiments of the present disclosure, the resistive portions are added at the drain region between the RRAM units to reduce the sneak current and improve the RRAM device performance. A method for forming the RRAM device according to an embodiment of the present disclosure will be discussed in the following of the present disclosure.

Figure 2:
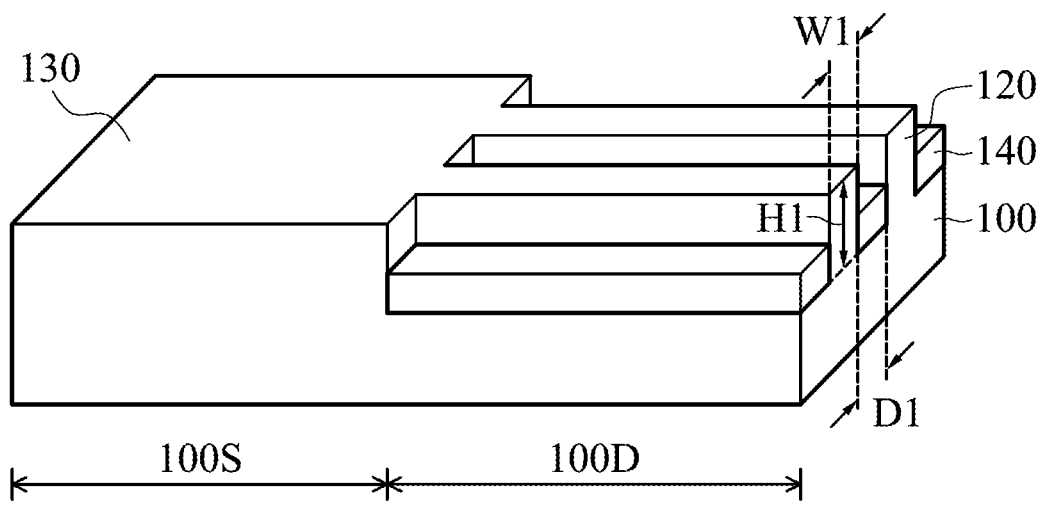
Figure 3:
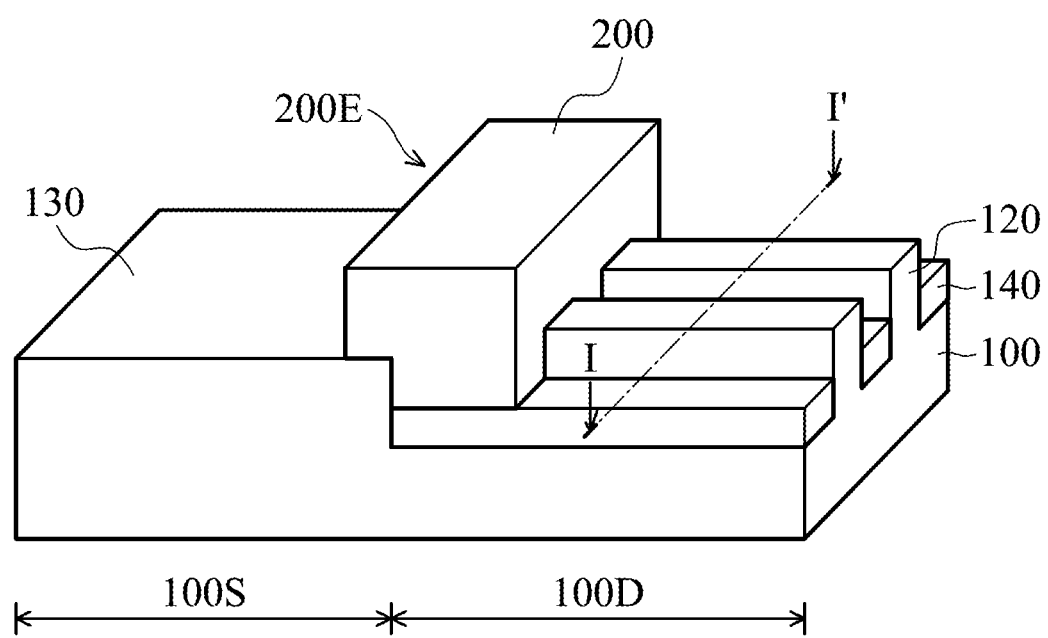
Figure 6:
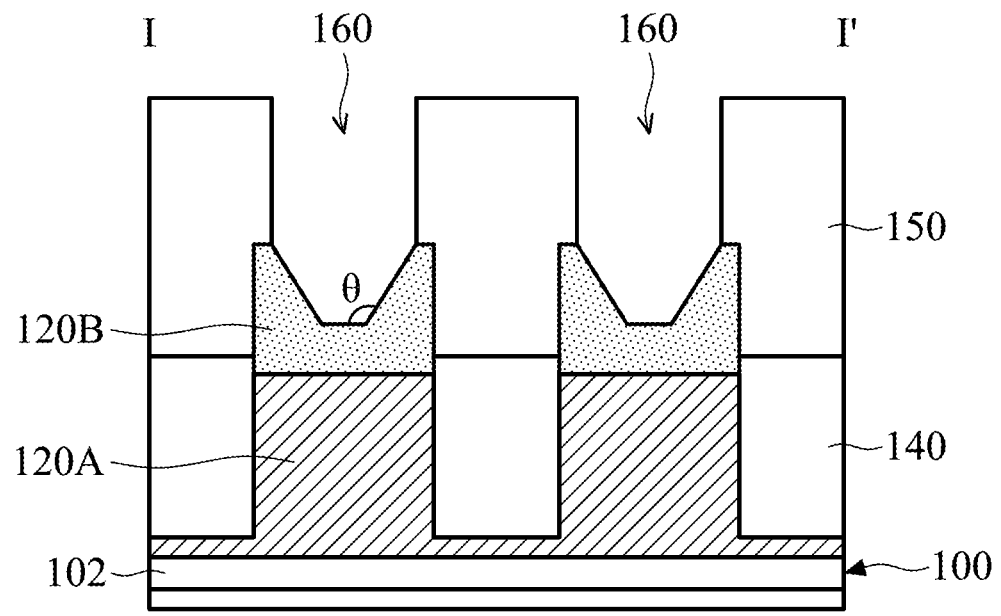
Figure 7:
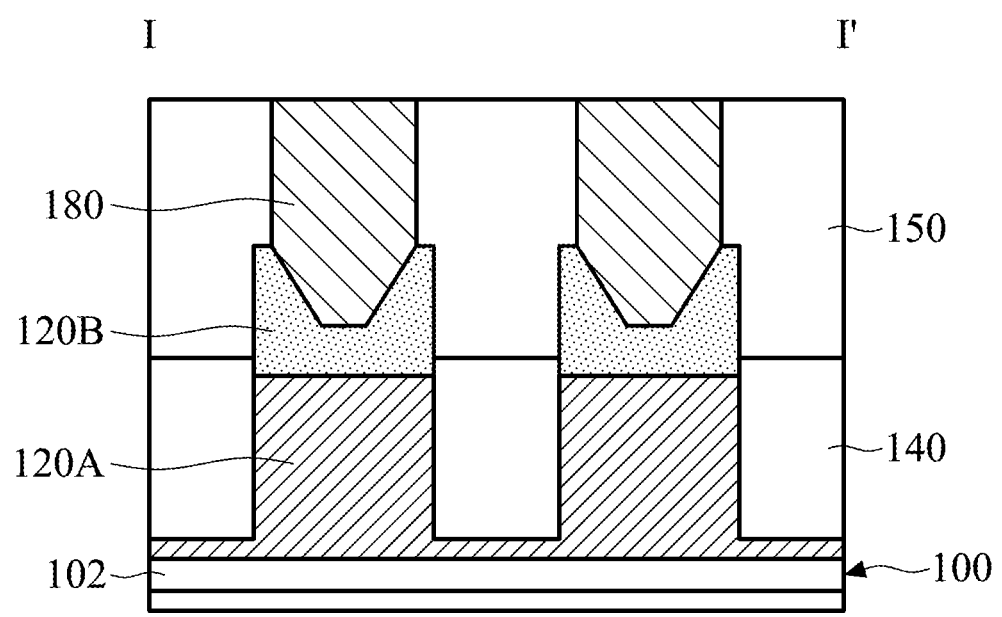
Figure 8:
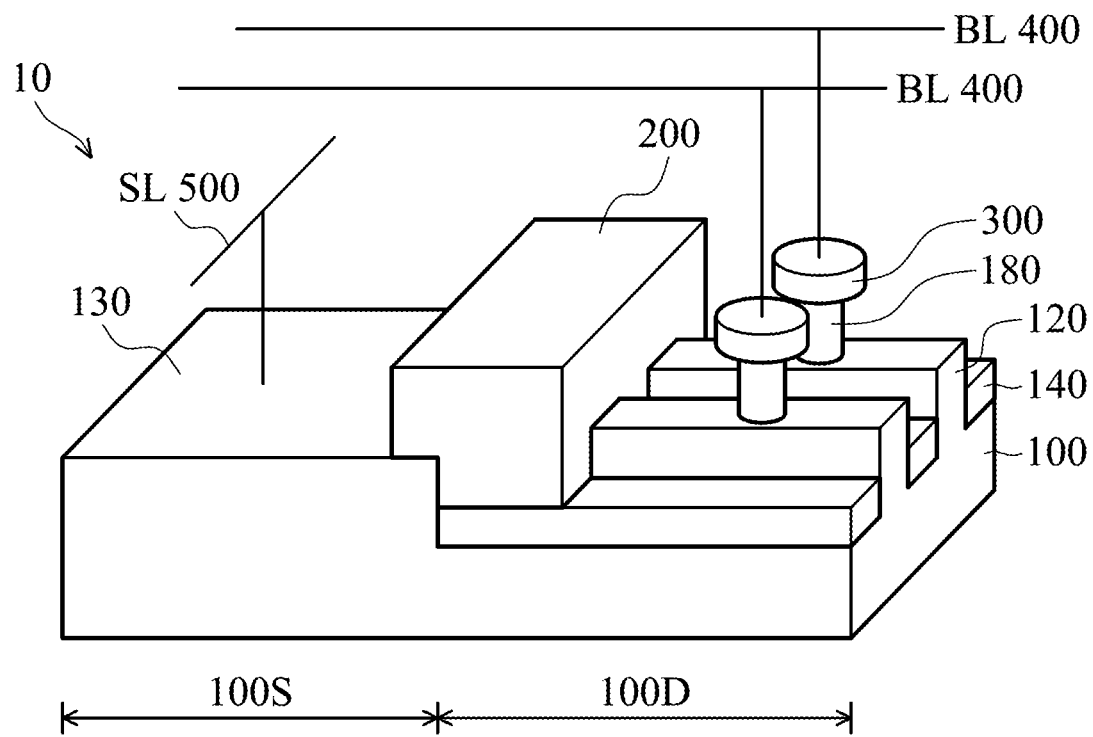
FIG. 8 is a perspective view of the resistive random access memory device in accordance with some embodiments of the present disclosure.

FIGS. 1-3 and 8 are perspective views illustrating intermediate stages of an exemplary method for forming the RRAM device 10 of FIG. 8 in accordance with some embodiments of the present disclosure. In addition, FIGS. 4A, 4B, and 5-7 are cross-sectional views taken along line I-I' of FIG. 3 illustrating intermediate stages of an exemplary method for forming the RRAM device 10 of FIG. 8 in accordance with some embodiments of the present disclosure.

FIG. 1 illustrates an initial step of a method for forming the RRAM device 10 according to an embodiment of the present disclosure. As shown in FIG. 1, a substrate 100 is provided, wherein the substrate 100 have a source region 100S and a drain region 100D adjacent to the source region 100S. In some embodiments, the substrate 100 may be a semiconductor substrate, such as a bulk semiconductor substrate, a semiconductor-on-insulator (SOI) substrate, or the like, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments of the present disclosure, the substrate 100 may have a well region (not illustrated in FIG. 1 but illustrated and described below with respect to FIGS. 4A and 4B). In some embodiments, the well region may be a p-type well region. In other embodiments, the well region may be an n-type well region.

FIG. 2 illustrates the formation of the semiconductor fins 120 and the semiconductor bulk 130 on the substrate 100. The semiconductor fins 120 are formed in the drain region 100D of the substrate 100, with respective isolation layers 140 on the substrate 100 between neighboring semiconductor fins 120. The semiconductor bulk 130 is formed in the source region 100S of the substrate 100, and the semiconductor fins 120 are adjacent to the semiconductor bulk 130. Compared to the RRAM device with a planar drain region, the conductive path between RRAM units of the RRAM device with multi-fin drain region is longer (for example, the conductive path is U-shape), and thus the sneak current can be reduced.

In some embodiments, the fin spacing D1 between neighboring semiconductor fins 120 is ranging from about 50 nm to about 150 nm, for example, about 100 nm. The semiconductor fins 120 has a height H1 ranging from about 250 nm to about 400 nm, for example, about 300 nm. The semiconductor fins 120 has a width WI ranging from about 50 nm to about 250 nm, for example, about 150 nm. If the semiconductor fins 120 is too wide, the resistance may not be large enough to reduce the sneak current, and if the semiconductor fins 120 is too narrow, the switching current may be too limiting to have good performance.

In some embodiments, the method for forming the semiconductor fins 120 and the semiconductor bulk 130 includes recessing trenches in the drain region 100D of the substrate 100 by an etching process to form the semiconductor fins 120 parallel to each other in the drain region 100D, thereby leaving the semiconductor bulk 130 in the source region 100S. For example, the etching process may be a dry etching process, such as a plasma etching process, a reactive ion etching process, another applicable process, or a combination thereof. FIG. 2 shows two semiconductor fins 120 for illustration purposes only, and the invention is not limited thereto. In other words, the numbers of the semiconductor fins 120 may be adjusted depending on the required characteristics of the finished product.

The isolation layers 140 are formed in each of the trenches between neighboring semiconductor fins 120 to be resistive portions at the drain region 100D between the RRAM units to be formed to reduce the sneak current and improve the performance of the RRAM device 10. The isolation layer 140 may include or be an insulating material such as an oxide (such as silicon oxide), a nitride, the like, or a combination thereof. The insulating material may be deposited by overfilling the trenches, followed by recessing to expose the top surfaces and a portion of sidewalls of the semiconductor fins 120, such that the semiconductor fins 120 protrude from between the remaining insulating material, which forms the isolation layer 140. Other processes and materials may be implemented to form the semiconductor fins 120, the semiconductor bulk 130, and the isolation layer 140. Although not shown in the figures, one or more liners may be formed along the trenches between neighboring semiconductor fins 120.

Next, as shown in FIG. 3, a gate structure 200 is formed on the substrate 100, and the source region 100S and the drain region 100D are on opposite sides of the gate structure 200. In some embodiments, the gate structure 200 wraps a portion of the semiconductor fins 120 and optionally covers a portion of the semiconductor bulk 130. In the embodiments where the gate structure 200 covers a portion of the semiconductor bulk 130, an edge 200E of the gate structure 200 near the source region 100S may be mis-aligned with a sidewall of the semiconductor bulk 130, as shown in FIG. 3. In the embodiments where the gate structure 200 doesn't cover a portion of the semiconductor bulk 130, an edge E of the gate structure 200 near the source region 100S may be aligned with a side wall of the semiconductor bulk 130 (not shown).

In some embodiments, the gate structure 200 includes a gate dielectric layer and a gate electrode (not shown). In some embodiments, the steps of forming the gate structure 200 may include conformally forming a material layer of the gate dielectric layer and a material layer of the gate electrode over the substrate 100 sequentially, and performing a patterning process on the those material layers to form the gate structure 200 on a portion of the drain region 100D of the substrate 100 and optionally a portion of the source region 100S of the substrate 100.

Figure 4A:
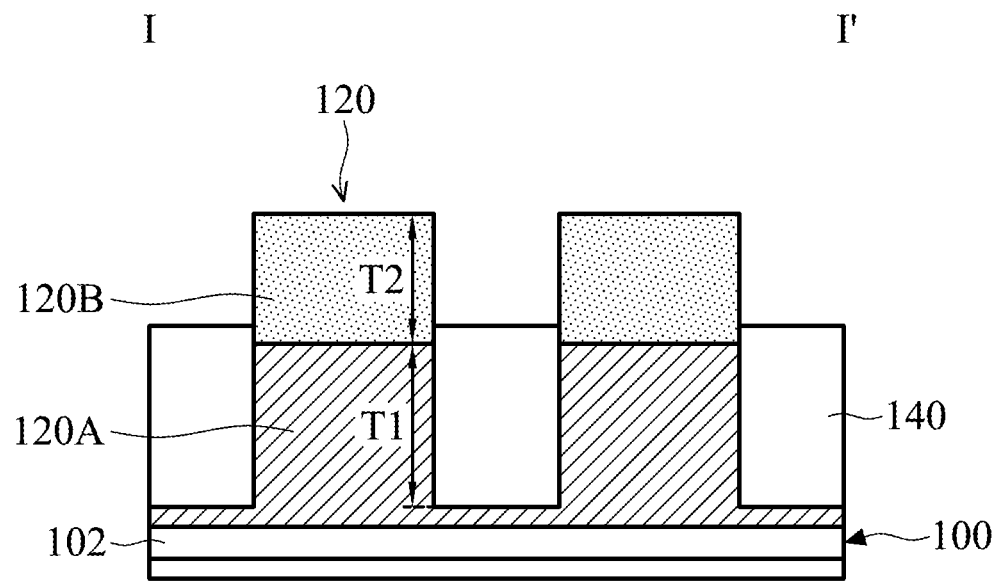
FIGS. 4A and 4B are a cross-sectional view taken along line I-I' of FIG. 3 illustrating intermediate stages of an exemplary method for forming the resistive random access memory device in accordance with different embodiments of the present disclosure.

FIG. 4A is a cross-sectional view taken along line I-I' of FIG. 3. As shown in FIG. 4A, multiple implantation processes are performed on the semiconductor fins 120 to form a lightly doped region 120A in the bottom portion of the semiconductor fins 120 and a heavily doped region 120B in an upper portion of the semiconductor fins 120. Since the lightly doped region 120A has a larger resistance than the heavily doped region 120B, the sneak current can be confined in the heavily doped region 120B, and thus the sneak current between RRAM units can be hindered.

Figure 4B:
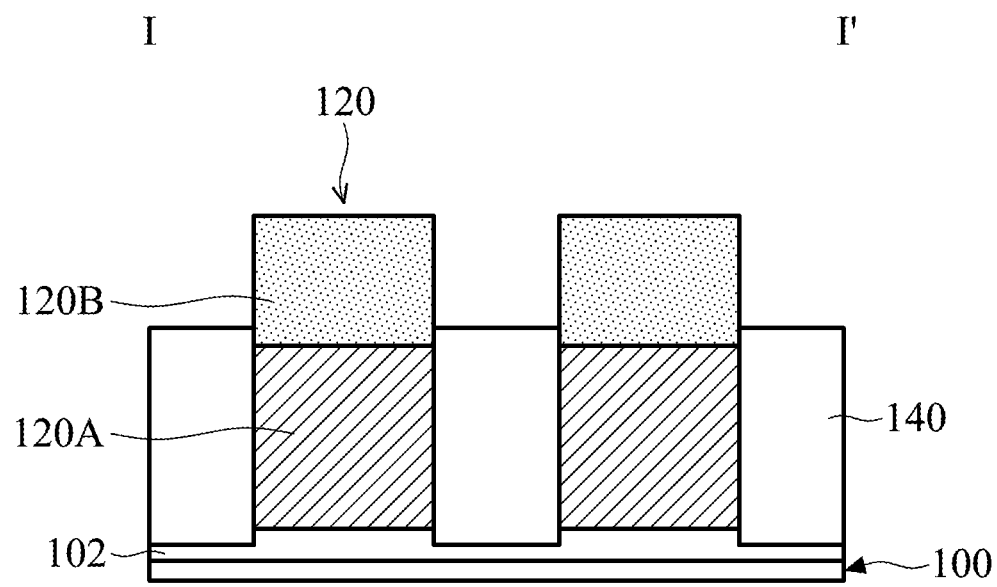

As mentioned before, the substrate 100 may have a well region 102. In some embodiments, by adjusting the parameters of the implantation process of the lightly doped region 120A, the bottom of fin semiconductor fins 120 may extend into or space apart from the well region 102. For example, when the energy of the implantation process of the lightly doped region 120A is large enough to form the lightly doped region 120A extending beyond the bottom of the semiconductor fins 120, then the well region 102 is spaced apart from a bottom of the semiconductor fins 120, as shown in FIG. 4A. Otherwise, the lightly doped region 120A may not reach the bottom of the semiconductor fins 120, and the semiconductor fins 120 are extending into the well region 102, as shown in FIG. 4B. In other embodiments, the bottom of fin semiconductor fins 120 may extend into the well region 102 by forming a deeper trench during the formation of the semiconductor fins 120.

The conductivity type of the well region 102 is opposite to the conductivity type of the lightly doped region 120A and the heavily doped region 120B. In this embodiment, a well region 102 of the substrate 100 is p-type, and the lightly doped region 120A and the heavily doped region 120B are formed by implanting n-type dopants, such as phosphorous (P) or arsenic (As), into the drain region 100D of the substrate 100. In other embodiments, the well region 102 of the substrate 100 is n-type, and the lightly doped region 120A and the heavily doped region 120B are formed by implanting p-type dopants, such as boron (B), in the semiconductor substrate 100.

In some embodiments, the lightly doped region 120A has a thickness T1 ranging from about 150 nm to about 250 nm, such as about 200 nm, and has a resistance that is greater than about 100 k ohm. The heavily doped region 120B has a thickness T2 ranging from about 50 nm to about 150 nm, such as about 100 nm, and has a resistance less than about 1000 ohm. The depth ratio of the lightly doped region 120A and the heavily doped region 120B is about 1 to about 3, for example, about 2. In some embodiments, a first implantation process is performed on the semiconductor fins 120 to form the lightly doped region 120A in the bottom portion of the semiconductor fins 120. The energy of the first implantation process may be in a range from about 50 key to about 300 key, for example, 150 keV. The dosage used in the first implantation process may be in a range from about $1 \times 10^{15}$ cm$^{-2}$ to about $1 \times 10^{17}$ cm$^{-2}$, for example, about $1 \times 10^{16}$ cm$^{-2}$. In some embodiments, a second implantation process is performed on the semiconductor fins 120 to form the heavily doped region 120B in the upper portion of the semiconductor fins 120. The energy of the second implantation process may be in a range from about 30 keV to about 200 keV, for example, 100 keV. The dosage used in the second implantation process may be in a range from about $1 \times 10^{17}$ cm$^{-2}$ to about $1 \times 10^{19}$ cm$^{-2}$, for example, about $1 \times 10^{17}$ cm$^{-2}$. The formation of the lightly doped region 120A is before the formation of the heavily doped region 120B as described herein, but the present disclosure is not limited thereto. For example, the implantation process for forming the heavily doped region 120B may be performed before the lightly doped region 120A is formed, and then the other implantation process is performed to form the lightly doped region 120A.

Although not shown in figures, an additional implantation process may be performed on the source region 100S to dope the semiconductor bulk 130. The conductivity type of the source region 100S is same as the conductivity type of the drain region 100D. In this embodiment, the source region 100S of the substrate 100 is n-type, and the semiconductor bulk 130 is doped by implanting n-type dopants, such as phosphorous (P) or arsenic (As). In other embodiments, the source region 100S of the substrate 100 is p-type, and the semiconductor bulk 130 is doped by implanting p-type dopants, such as boron (B). The energy of the additional implantation process may be in a range from about 30 keV to about 200 keV, for example, 100 key. The dosage used in the additional implantation process may be in a range from about $1 \times 15$ cm$^{-2}$ to about $1 \times 18$ cm$^{-2}$, for example, about $1 \times 16$ cm$^{-2}$. The implantation of the source region 100S is after the implantation of the drain region 100D as described herein, but the present disclosure is not limited thereto. For example, the implantation for the source region 100S may be performed before the implantation of the drain region 100D.

Figure 5:
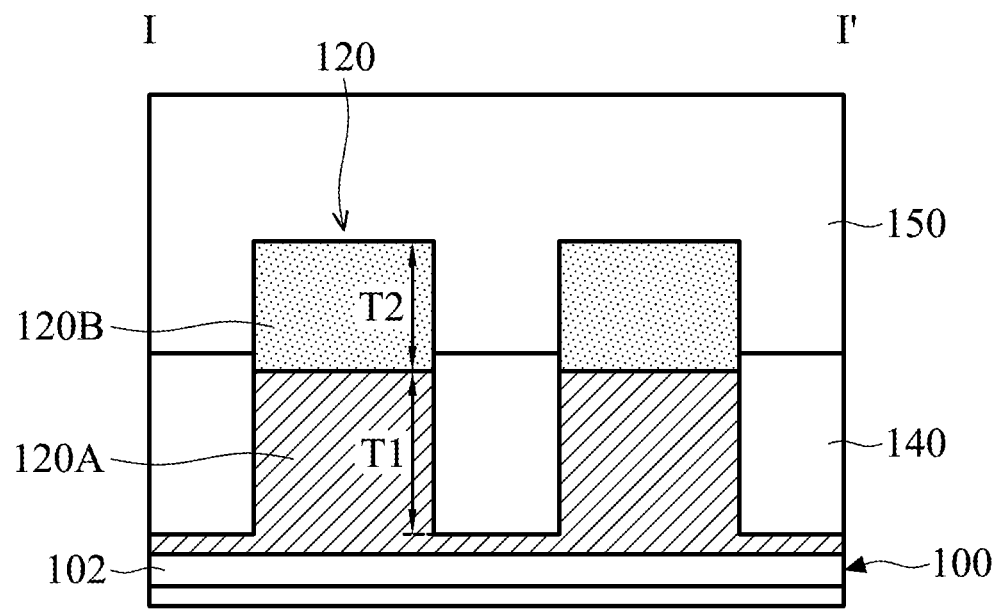
FIGS. 5-7 are cross-sectional views taken along line I-I' of FIG. 3 illustrating intermediate stages of an exemplary method for forming the resistive random access memory device in accordance with some embodiments of the present disclosure.

FIG. 5 shows the subsequent process for forming the RRAM device 10 continued with the structure of FIG. 4A. It should be noted that the RRAM device 10 can also be formed by using the structure of FIG. 4B. Next, referring to FIG. 5, a dielectric layer 150 is formed on the isolation layer 140, and the dielectric layer 150 covers the semiconductor fins 120. As shown in FIG. 6, contact openings 160 are formed in the dielectric layer 150, wherein the contact openings 160 extend into the heavily doped region 120B of the semiconductor fins 120, but do not extend into the lightly doped region 120A. In some embodiments, the contact openings 160 may have a tapered bottom portion, that is, the contact openings 160 may have inclined sidewalls in the heavily doped region 120B of the semiconductor fins 120, so that a contact 180 formed in the contact opening 160 may be edge-contacted with the semiconductor fins 120 (not illustrated in FIG. 6 but illustrated and described below with respect to FIG. 7), which helps to eliminate the current bending, thereby improving the performance of the RRAM device 10 (the details of which will be discussed later).

In some embodiments, the contact openings 160 may be formed in the dielectric layer 150 and the heavily doped region 120B of the semiconductor fins 120 by a patterning process.

In some embodiments, a patterned photoresist layer (not shown) having openings corresponding to the contact openings 160 may be formed on the dielectric layer 150 by a lithography process, and then an etching process may be performed to remove a portion of the dielectric layer 150 exposed by the openings of the patterned photoresist layer (not shown) to expose top surfaces of the semiconductor fins 120. Next, a wet etching process, such as a crystallographic etching process, is performed on the top surfaces of the semiconductor fins 120 to form the contact openings 160. In some embodiments, as shown in FIG. 6, during the crystallographic etching process, the portion of the contact openings 160 in the semiconductor fins 120 may be formed with facets not perpendicular to the top surface of the substrate 100, which may correspond to crystalline planes of the substrate 100. For example, an angle θ between a lower sidewall of the contact opening 160 and a bottom surface of the contact opening 160 may be in a range from about 120 degrees to about 150 degrees, such as about 135 degrees. For example, a depth of the portion of the contact openings 160 in the semiconductor fins 120 may be in a range from about 30 nm to about 80 nm, for example, 50 nm. The contact openings 160 may have any shape from the top view aspect, for example, circular shape, rectangular shape, or another applicable shape.

Next, as shown in FIG. 7, a conductive material is deposited in the contact openings 160 to form contacts 180, wherein the bottom portion of the contact 180 is embedded in the heavily doped region 120B of the semiconductor fin 120. Each of the RRAM units (not illustrated in FIG. 7 but illustrated and described below with respect to FIG. 8) may electrically connect the corresponding semiconductor fin 120 with the respective contact 180. Since the portion of the contact openings 160 in the semiconductor fins 120 may be formed with facets, the bottom portion of the contact 180 embedded in the semiconductor fins 120 may have slanted edge (see FIG. 7), which allows the contacts 180 to collect all current without current bending, and therefore the driving current is improved.

Next, referring to FIG. 8, in which the dielectric layer 150 is not shown for clarity of illustration, RRAM units 300 are formed on the contacts 180 correspondingly. In some embodiment, the RRAM unit 300 may be a RRAM stack including a bottom electrode layer, a resistive switching layer, a barrier layer, an oxygen exchange layer, and a top electrode layer disposed in sequence. In some embodiments, the oxygen exchange layer can help the resistive switching layer to form filaments. Specifically, after applying voltage to form the filaments in the resistive switching layer, ionized oxygen atoms can be stored in the oxygen exchange layer. Moreover, the barrier layer can help to confine the oxygen atoms in the oxygen exchange layer, and allows more stable filaments formed in a memory cell and better filament reproducibility of the RRAM unit 300.

Still referring to FIG. 8, bit lines 400 are formed to electrically connect the RRAM units 300 correspondingly, and a source line 500 is formed to electrically connect the semiconductor bulk 130. The methods of foiling the bit lines 400 and the source line 500 are known to those having ordinary skill in the art, so the details are not reiterated herein.

As shown in FIG. 8, the RRAM device 10 includes a gate structure 200 on a substrate 100, and a source region 100S and a drain region 100D disposed on opposite sides of the gate structure 200 on the substrate 100. The source region 100S includes a semiconductor bulk 130, and the drain region 100D includes a plurality of semiconductor fins 120 adjacent to the semiconductor bulk 130, wherein the semiconductor fins 120 are separated from each other by an isolation layer 140. The RRAM device 10 further includes a plurality of RRAM units 300, wherein each of the RRAM units 300 electrically contacts one of the semiconductor fins 120. The conductive path between RRAM units 300 of the RRAM device 10 with multi-fin drain region (i.e. the semiconductor fins 120) is much more resistive than that of the RRAM device with a planar drain region, and thus sneak current can be reduced.

In some embodiments, the RRAM device 10 further includes a lightly doped region 120A in the bottom portion of the semiconductor fins 120, and a heavily doped region 120B in an upper portion of the semiconductor fins 120, wherein the resistance of the lightly doped region 120A is greater than 100 k ohm. Since the lightly doped region 120A has a large resistance, the sneak current can be confined in the heavily doped region 120B, and thus sneak current between RRAM units 300 can be hindered.

In some embodiments, each of the RRAM units 300 electrically connects one of the semiconductor fin 120 with a contact 180, wherein the bottom portion of the contact 180 is embedded in the heavily doped region 120B of the semiconductor fins 180. In some embodiments, the bottom portion of the contact 180 has a slanted edge, which allows the contact 180 to collect all of the current without the current bending, and therefore the driving current is improved.

In summary, the resistive random access memory device according to embodiments of the present disclosure includes an isolation layer at the drain region between the RRAM units to form the drain region having a multi-fin structure, thereby reducing the sneak current and improving the device performance. In addition, since the lightly doped region of the semiconductor fins has a large resistance, the sneak current can be confined in the heavily doped region of the semiconductor fins, and thus the sneak current between RRAM units can be hindered. Furthermore, the bottom portion of the contacts 180 embedded in the semiconductor fins have slanted edges, which allows the contacts 180 to collect all current without current bending, and therefore the driving current is improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) device, comprising:
    a gate structure on a substrate;
    a source region and a drain region disposed on opposite sides of the gate structure on the substrate, wherein the source region comprises a semiconductor bulk, and the drain region comprises a plurality of semiconductor fins adjacent to the semiconductor bulk, and wherein the semiconductor fins are separated from each other by an isolation layer;
    a plurality of RRAM units, wherein each of the RRAM units electrically contacts one of the semiconductor fins, wherein each of the RRAM units electrically connects one of the semiconductor fins with a contact, wherein a bottom portion of the contact is embedded in a heavily doped region of the semiconductor fins, wherein the heavily doped region is in an upper portion of the semiconductor fins and in direct contact with the bottom portion of the contact and
    a lightly doped region in a bottom portion of the semiconductor fins, wherein a resistance of the lightly doped region is greater than 100 k ohm.

2. The RRAM device of claim 1, wherein a depth ratio of the lightly doped region and the heavily doped region is 1 to 3.

3. The RRAM device of claim 1, wherein the semiconductor fin has a height ranging from 250 nm to 400 nm.

4. The RRAM device of claim 1, wherein the bottom portion of the contact has a slanted edge.

5. The RRAM device of claim 1, wherein the substrate comprises a well region, and wherein the semiconductor fins extend into the well region.

6. The RRAM device of claim 1, further comprising a plurality of bit lines perpendicular to the gate structure, wherein each of the bit lines electrically contacts to one of the RRAM units.

7. The RRAM device of claim 1, further comprising a source line parallel to the gate structure, wherein the source line electrically connects to the semiconductor bulk.

8. A method for forming the RRAM device of claim 1, comprising:
    providing a substrate having a source region and a drain region adjacent to the source region;
    recessing the substrate to form a semiconductor bulk in the source region and to form a plurality of semiconductor fins parallel to each other in the drain region, wherein the semiconductor fins are adjacent to the semiconductor bulk;
    forming a gate structure on the substrate, wherein the source region and the drain region are on opposite sides of the gate structure; and
    forming a plurality of RRAM units, wherein each of the RRAM units electrically contacts one of the semiconductor fins.

9. The method for forming an RRAM device of claim 8, further comprising:
    performing a first implantation process on the semiconductor fins to form a lightly doped region in a bottom portion of the semiconductor fins; and
    performing a second implantation process on the semiconductor fins to form a heavily doped region in an upper portion of the semiconductor fins.

10. The method for forming an RRAM device of claim 9, wherein a depth ratio of the lightly doped region and the heavily doped region is about 1 to about 3.

11. The method for forming an RRAM device of claim 8, wherein the semiconductor fin has a height ranging from about 250 nm to about 400 nm.

12. The method for forming an RRAM device of claim 8, further comprising:
   forming a plurality of contacts on the semiconductor fins, wherein each of the RRAM units electrically contacts one of the semiconductor fins with the contacts, wherein a bottom portion of the contact is embedded in the heavily doped region of the semiconductor fin.

13. The method for forming an RRAM device of claim 12, wherein forming the plurality of contacts comprises:
   etching the semiconductor fins to form a contact opening in the heavily doped region of the semiconductor fins, wherein an angle between a sidewall of the contact opening and a bottom surface of the contact opening is about 135 degrees; and
   depositing a conductive material in the contact opening to form the contacts.

14. The method for forming an RRAM device of claim 12, wherein etching the semiconductor fin is performed used a wet etching process.

15. The method for forming an RRAM device of claim 12, wherein an etchant of the wet etching process comprises KOH.

16. The method for forming an RRAM device of claim 8, further comprising:
   forming a well region in the substrate, wherein the semiconductor fins extend into the well region.

* * * * *